HEAT DISSIPATING MODULE ASSEMBLY AND METHOD

Filed March 3, 1967 2 Sheets-Sheet 1

INVENTORS
EUGENE H. MELAN
HOWARD F. TEPPER
BY Joseph L. Spiegel
ATTORNEY

United States Patent Office 3,414,775

Patented Dec. 3, 1968

3,414,775
HEAT DISSIPATING MODULE ASSEMBLY AND METHOD

Eugene H. Melan, Poughkeepsie, and Howard F. Tepper, Yorktown Heights, N.Y., assignors to International Business Machines Corporation, Armonk, N.Y., a corporation of New York Filed Mar. 3, 1967, Ser. No. 620,437
7 Claims. (Cl. 317—100)

ABSTRACT OF THE DISCLOSURE

Active and passive circuit elements are joined to the conductive pattern formed on the surface of a pinned, microminiature ceramic substrate. A copper rivet has a base plate secured against the surface of the substrate in close thermal relationship to the elements, and a tubular stud projecting upwardly therefrom. An apertured, finned copper cap is placed over the stud. Its sidewalls are crimped against the sidewalls of the substrate while the stud is flared over the cap opening. The assembly is capable of rapid removal of heat while providing environmental protection for the circuit elements.

*Background of invention*

*Field of invention and prior art*

The present invention relates to dissipator assemblies for rapidly removing heat from microminiature modules as well as providing environmental protection for active and passive devices forming part of the module.

With the advent of hybrid microminiature technology (see, for example, an application of Davis et al. entitled, "Functional Components," U.S. Ser. No. 300,734, filed Aug. 8, 1963, and assigned to the same assignee as the present invention), the need to extend this technology to power device applications such as in memory and mechanical drive circuits was apparent. While the hybrid microminiature technology approach of Davis et al. makes low-cost, high-performance microminiaturization a reality, it was primarily designed for low-power application. The packaging approach set forth in this application expands the capability of hybrid microminiaturization into the area of increased power handling capability permitting the construction of a thermally efficient, mechanically rugged assembly.

*Summary of the invention*

An object of the present invention is increasing the power handling capabilities of hybrid microminiature modules while providing environmental protection of same.

Another object is a heat dissipating module assembly amenable to mass production techniques.

These and other objects are accomplished in accordance with the present invention, one illustartive embodiment of which comprises a pinned, microminiature insulating substrate of high thermal conductivity having an electrically conductive pattern formed thereon. The collector terminals on the backside of a plurality of high power semiconductive chip devices are mounted upon the pattern to form an effective thermal bond between the substrate and semiconductive material. Base and emitter terminals on the top-side of the device are connected to the pattern via overlying copper straps. A copper rivet has a base plate solder reflowed to the surface of the substrate in close thermal relationship to the power devices, and a tubular stud projecting upwardly therefrom. An apertured, finned, copper cap is placed over the stud. Its sidewalls are crimped against the sidewalls of the substrate, while the stud is flared over the cap opening. The assembly is capable of rapid removal of heat. A major heat path of low thermal resistance connects the chips with the heat-dissipating cap. The latter draws heat from the chips via the stud, plate, substrate, pattern and finally the chips, directly from the collector terminal and indirectly from emitter and base terminals through the straps. It also draws heat from the chips via the pattern, and substrate directly to the sidewalls. Minor heat paths of higher thermal resistance are established between the chips and outer contact pins via the pattern and between the chips and inner dummy pins, when included, via the substrate.

The assembly of the present invention by means of its thermally high conductive, electrically isolating substrate and the low thermal resistance path to the heat dissipating finned cap provides a means by which both active chip devices such as transistors and diodes and passive elements such as resistor and capacitor can be joined into a compact assembly forming either functional electronic driving circuits, or other power producing circuits or combinations of discrete power electronic devices. In addition, the assembly provides an electrostatic shield when tied to an electrical ground, but in addition it is electrically isolated from the devices or circuits contained within the assembly.

*Brief description of the drawings*

The foregoing and other objects, features and advantages of the invention will be apparent from the following, more particular description of the preferred embodiments of the invention as illustrated in the accompanying drawings, wherein.

*Description of the preferred embodiments*

The present invention finds application in any microminiature module assembly where dissipation of heat and environmental protection of certain of the components, for example active and passive devices, are prime considerations. Such assemblies typically interconnect a plurality of high power devices in a preferred arrangement to form a memory, mechanical drive or other circuit. The fabrication of one such assembly is illustrated in FIGURES 1A through 1F.

Figure 1A:
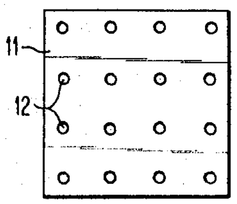
FIGURES 1A through 1F are top views of the heat dissipating module assembly of the present invention at various stages of its fabrication process.
Figure 1B:
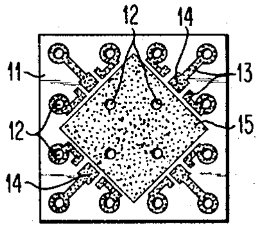

Referring to FIGURE 1A, the fabrication process of the heat dissipating module assembly begins with an electrically insulating substrate 11. The substrate may be of any dimension, but typically for microminiaturized purposes is a 0.455" square, 0.06" thick. It should possess good thermal conductivity characteristics and be inert to relatively high firing temperatures. Good thermal conductivity characteristics are required due to the close spacing of heat-producing, high power active, and in some cases passive, elements to be secured to the substrate. The substrate will form a portion of the major thermal path from these elements to a heat dissipation means. One material that satisfies these criteria is a high purity, 95% alumina composition which has a thermal conductivity of approximately 12 B.t.u./hr./ft./° F. Alumina also has excellent electrical insulating, high temperature properties. Beryllia may also be used. The substrate also includes a plurality of apertures 12. Electric terminal members will be inserted in those along the outer perimeter, while in the inner apertures thermally conductive pins may be inserted.

Prior to a metallization step the substrate is cleaned by immersion in trichloroethylene. The immersed substrate is placed in an ultrasonic cleaner for approximately five minutes. Upon removal, substrates are dried in warm air for approximately fifteen minutes.

After cleaning, the substrate is ready for metallization. Metallizing compositions, typically compositions of gold, silver, platinum and palladium with a vitreous frit, are used. The composition must have excellent adhesion properties to the substrate, as well as provide good electrical and thermal conductivity and soldering characteristics. Silver-palladium metallizing compositions found to be satisfactory are disclosed in a U.S. Patent Application of Miller, entitled, "Conductive Element, Composition and Method", Ser. No. 370,467, filed May 27, 1964, and assigned to the same assignee as the present invention, now U.S. Patent 3,374,110 issued Mar. 19, 1968. Such silver-palladium compositions possess high electrical and thermal conductivity along with relatively low cost.

The composition in paste form is printed (FIGURE 1B) onto the substrate 11 by silk screening or other conventional printing processes. A silk screen or mask having the desired pattern is placed over the substrate. The paste is squeegeed, doctored, or extruded onto the screen. Pressure is applied to spread the paste through the screen and onto the substrate. The pattern in the screen is reproduced at a thickness determined by a number of variables, for example, squeegee pressure and angle, paste viscosity, screen openings, and mask thickness. In a typical embodiment the paste is printed to a thickness of 2 mils. The screen is then removed from the substrate and the printed metallizing paste composition is ready to be dried and fired.

During drying, most of the liquid is removed and the resulting printed pattern is solidified. Typical drying conditions are in air at 100° C. for 15 minutes.

Drying is followed by the firing operation. The firing temperature and time of firing, of course, are largely dependent upon the vitreous frit used. Typically, however, firing is carried out in a continuous belt furnace in air at 750–800° C. for approximately 30 minutes. The now fused pattern is brought to room temperature. The pattern so formed includes: the circuit layout having lines 13 typically 5 to 10 mls. in width and enlarged collector terminal pads 14, typically 0.04 x 0.04" and, the central rivet pad 15, typically .265 x .265". The lines 13 extend from the outer terminal apertures 12. The lines which extend from the corner terminal apertures end at the collector pads 14. These collector pads 14 are located in close proximity to the rivet pad 15, thereby minimizing the length of the thermal conduction path between the active devices and rivet subsequently to be mounted.

Figure 1C:
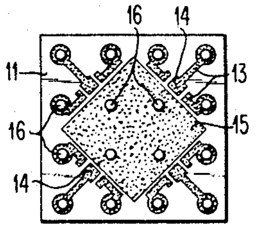

In FIGURE 1C pins 16 are inserted in the apertures 12. Each outer aperture is suitably positioned in the path of one of the lines 13 as well as being spaced about the perimeter of the substrate 11. Each inner aperture is surrounded by the rivet pad 15. The pins 16 are approximately 230 mils long, 20 mils in diameter and 125 mils in spacing. Any number of materials may be employed for the pins but OFHC copper has been found to be very satisfactory. The pins 16 may be inserted in the apertures by suitable apparatus. Thereafter mechanical forces are applied to the pins to expand the metal above and below the apertures and thereby lock the pins in the apertures. The pins in the outer apertures complete an electrical path from the lines 13 to external circuitry (not shown) while the pins in the inner apertures form minor, but additional heat paths from the substrate 11.

Figure 1D:
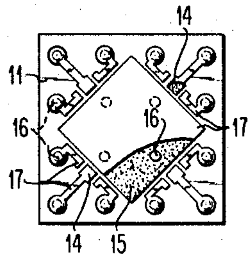
Figure 1E:
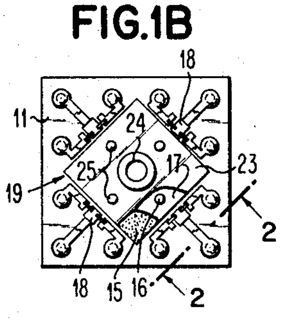
Figure 1F:
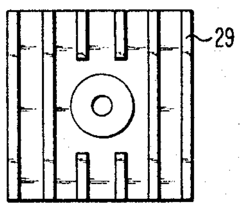

A tinning operation (FIGURE 1D) is the next step in the process. The tinning provides electrical connections between the pins 16 in the outer apertures and the conductive lines 13 and reduces the series resistance of the lines. Further, solder is provided for subsequent joining of active elements to the collector pads 14 and of a rivet to the rivet pad 15. Alternate methods, for example plating, may be employed to provide the same results as tinning. Prior to tinning, the substrates are ultrasonically cleaned. A flux remover and liquid degreaser are employed to ready the surface of the substrate conductors for the tinning operation. A high temperature solder is employed in the tinning operation in order that the substrate may be later soldered to a printed circuit board without melting the solder and thereby affecting any joints formed between the solder and circuit elements. One solder found to have the required characteristic is a 90% lead and 10% tin solder which has a melting temperature about 300° C. A dip solder process is employed to coat the conductive pattern of the substrate with solder. Solder 17, as shown in FIGURE 1D, does not adhere to the surface of the alumina substrate 11 due to its high glass-like content which is not wetted by the solder. A uniform and relatively low solder height is achieved on the collector pads 14. In some instances where curvature of the film formed by the solder is great, the solder coated collector pads 14 are flattened. Flattening is accomplished by means of a spring loaded piston with a typical force of twelve pounds applied to each collector pad. On the other hand, no flattening of the rivet pad 15 will be required since during subsequent joining the weight of the rivet tends to distribute the liquidus solder evenly.

After coating of the pattern, the substrate is solder-dipped on the pin terminal side to point the ends thereof for ease of insertion into printed circuit boards. The entire tinning operation is suitable for automated techniques. Apparatus for performing such a tinning operation is described in the IBM Technical Disclosure Bulletin, July 1963, p. 36.

Figure 2:
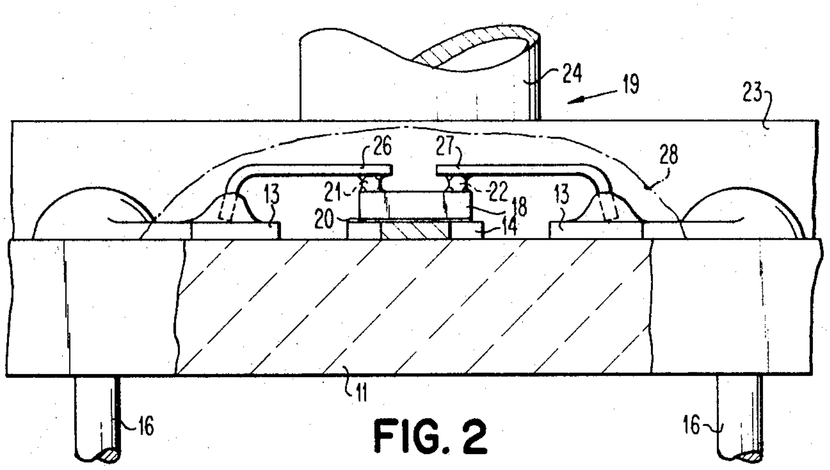
FIGURE 2 is an enlarged sectional view partially broken away, taken along lines 2—2 of FIGURE 1E.

The next operation, (FIGURE 1E) is fastening active devices 18 and rivet 19 to the substrate 11. A typical semiconductor chip device is more fully described in a U.S. patent applicaiton of Castrucci et al., entitled, "Solderable Backside Ohmic Contact Metal System for Semiconductor Devices and Fabrication Process Therefor," Ser. No. 609,071, filed Jan. 13, 1967, and assigned to the same assignee as the present invention. As best seen in FIGURE 2, a semiconductive chip device 18 is shown joined to the pad 14 at 20 by a solderable metal film, typically Cr-Cu-Au, forming electrical contact to the collector region of the device 18 via an ohmic metal contact system. Nickel plated copper balls 21, 22 typically five mils in diameter, provide terminal contacts to the base and emitter regions, respectively, of the device 18.

Returning to FIGURE 1E, the rivet 19 of high thermal conductivity, typically copper, includes a base plate 23 and upwardly projecting stud 24. Where the substrate includes pins 16 in its inner apertures, the plate 23 is provided with apertures 25 to be placed in registry with the top of the pins in the inner apertures.

In order to join the devices 18 and rivet 19 to the substrate 11, the tinned pads 14 and 15 and the contacts 21 and 22 are fluxed. The collector contacts 20 of the devices 18 and base plate 23 of rivet 19, are then placed on their respective pads, through the use of a suitable jig, the flux acting as a glue to retain the devices 18 and rivet 19 in proper position. Nickel plated, solder coated copper straps 26 and 27 that may be L-shaped are mounted in electrical contact between the contacts 21 and 22, respectively, of the active devices 18 and the solder coated lines 13. The particular material chosen for the straps permits reflow bonding and provides high current-carrying capability. Thereafter, the substrate 11 is heated in a nitrogen belt furnace at approximately 370° C., thereby establishing simultaneously, a solder reflow joint between collector contacts 20 and tinner pads 14, between base plate 23 and tinned pad 15, between one end of straps 26, 27 and their respective contacts 21, 22 and between the opposite ends of straps 26 and 27 and their respective tinned lines 13. Although none of the circuit elements require a hermeitcally sealed enclosure, a plastic coating 28 (FIGURE 2) is applied to protect mechanically the elements and reduce corrosion of the solder land under high humidity conditions. The modules are dipped into the plastic and dried in a sutiable oven for a period of three hours at 150° C. depending upon the plastic employed. One material found to be satisfactory is a silicone varnish such as "Sylgard" sold by the Dow Corning Corporation.

Figure 3:
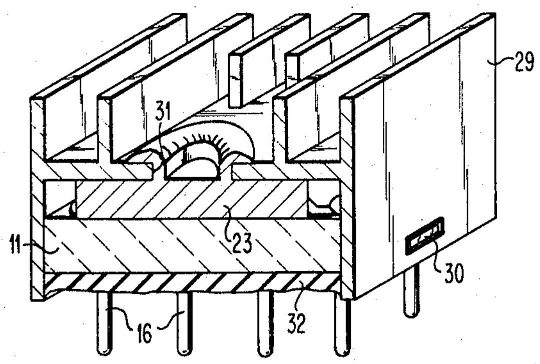
FIGURE 3 is a perspective, sectional, elevational view of a completed heat dissipating module assembly.

In the next operation (FIGURE 1F) an apertured, finned cap 29 of thermally conductive material, typically copper, is placed over the substrate and its sides are crimped as at 30 (FIGURE 3) to the sides of the substrate. The finned design is chosen for its large surface area, permitting good thermal dissipation. The cap material is preferably the same as the rivet 19 to avoid galvanic corrosion in a high humidity environment, and in addition combines high thermal conductivity and excellent formability with excellent solderability. The tubular stud 24 on the rivet 19 protruding through the aperture 31 in the center of the cap 29 is flared over with a spinning tool. If desired, the module may then be backsealed at 32 (FIGURE 3) with an electrically insulating, yieldable substance such as RTV60 silicone rubber, sold by General Electric or Dow Corning's Q–90167. This completes the module assembly.

A major heat path of low thermal resistance thus connects the chips 18 with heat-dissipating cap 29. The latter draws heat from chips 18 via stud 24, plate 23, substrate 11, the pattern and finally the chips 18, directly from the collector terminal 20 and indirectly from emitter and base terminals 21, 22 through straps 26, 27. It also draws heat from chips 18 via the pattern, substrate 11 directly to its sidewalls. Minor heat paths of higher thermal resistance are established between chips 18 and pins 16 in outer apertures 12 via the pattern and between chips 18 and pins in inner apertures 12, when included, via pattern 13 and substrate 11. In addition, the cap 29 can be filled with various heat conductive materials to further increase thermal efficiency.

Figure 4:
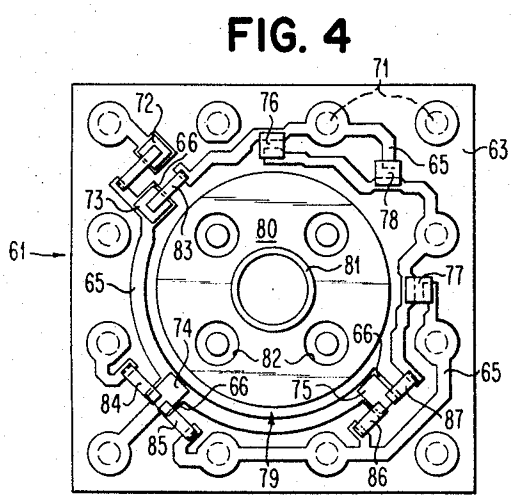
FIGURE 4 is a top view of an alternate embodiment of the heat dissipating module assembly of the present invention prior to capping.
Figure 5:
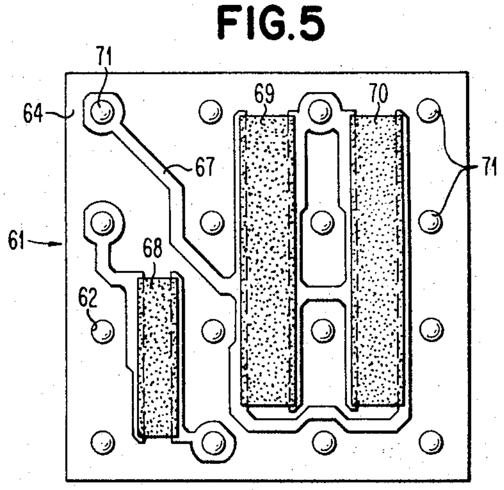
FIGURE 5 is a bottom view of the assembly of FIGURE 4.
Figure 6:
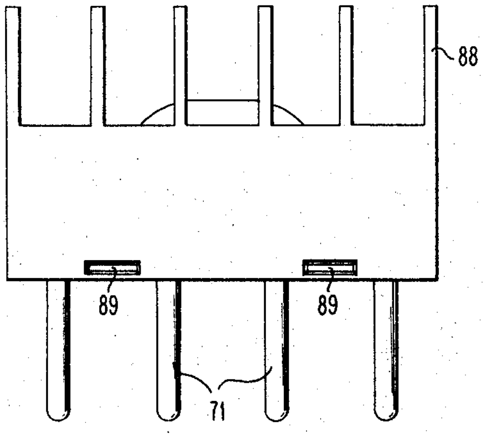
FIGURE 6 is an elevational view of the FIGURE 4 embodiment capped.

FIGURES 4–6 disclose another embodiment of the present invention. The assembly includes a substrate 61 apertured at 62. A conductive pattern is formed as before, but both on the top surface 63 (FIGURE 4) and bottom surface 64 (FIGURE 5). The pattern on the top surface 63 includes a circuit layout having lines 65 and enlarged pads 66, and a rivet pad (not shown). The pattern on the bottom surface 64 includes the circuit layout 67.

The next operation in the process is printing resistor elements 68, 69, 70 on the bottom surface 64, at the appropriate positions in the circuit layout 67. A conventional silk screen process is also employed to print the resistors 68–70. The resistors are printed in relatively wide spaces between parallel disposed conductor pads of the circuit layout 67. The resistor composition is a metal-glass paste which is squeegeed onto the silk screen. Dispersed conductive insulating materials have good deposition and other properties. One composition found to have excellent reproducibility in the process is a palladium oxide-silver composition which is described in U.S. Patent 3,248,345 to Mones et al., issued Apr. 26, 1966. The resistors are printed using standard silk screen processing and then fired to solidify same. These operations are well known in the art (See, for example, the above-referred to application of Davis et al.) and therefore will not be further described here.

After insertion of pins 71 followed by a tinning operation, the resistors 68–70 screened on the substrate bottom surface 64 are tailored or trimmed to their desired values. An explanation of the trimming operation can also be found in the above referred-to Davis et al. application.

The next operation is fastening chip devices and a rivet to the top surface 63 of substrate 61. The chip devices to be joined include: diodes 72 and 73 and transistors 74 and 75 which are to be backside mounted as are the devices in the FIGURES 1–3 embodiment; and the diodes 76, 77, 78. Diodes 76–78 are more fully described in a paper entitled, "Hermetically Sealed Chip Diode and Transistors," by J. R. Langdon et al. which was presented to the 1961 Electron Device meeting in Washington, D.C., on Oct. 27, 1961. An abstract of the paper appears in "IRE Transactions on Electron Devices," at p. 114 (Jan. 1962). The method of joining diodes 76, 77, 78 to the circuit lines 65 is more fully described in the above referred-to Davis et al. application.

The rivet 79, of high thermal conductivity, preferably copper, includes a circular base plate 80 and upwardly projecting stud 81. Where the substrate includes pins 71 in the inner apertures, the plate 80 is provided with apertures 82 to be placed in registry with the top of the pins in the inner apertures.

In order to join the devices and rivet to the substrate surface 63 the tinned pads and the contacts of the various devices are fluxed. The active chip devices are then placed at their respective positions on the circuit layout and the rivet 79 is placed on its pad. Straps 83–87 are mounted in electrical contact with the contacts on the upper surface of the devices 72–75. Thereafter the substrate is heated in a nitrogen belt furnace at approximately 370° C., thereby establishing simultaneously a solder reflow joint between the devices 72–75 and the circuit layout pads 66, between the contacts of devices 76–78 and the lines of the circuit layout 65, between one end of the straps 83–87 and contacts on the top surfaces of devices 72–75, between the opposite ends of the straps 83–87 and the tinned lines of layout 66, and between the base plate 80 of the rivet 79 and its pad. If desired, a plastic coating is applied to protect mechanically the elements and reduce corrosion of the solder layers under high humidity conditions.

In the next operation, an apertured finned cap 88 of thermally conductive material, typically copper, is placed over the top surface 63 of the substrate 61, and its sides are crimped as at 89. The tubular stud 81 on the rivet 79, which protrudes through an aperture in the center of the cap, is flared over with a spinning tool. If desired, the module may then be backsealed with an electrically insulating, yieldable substance. This completes the assembly.

Figure 7:
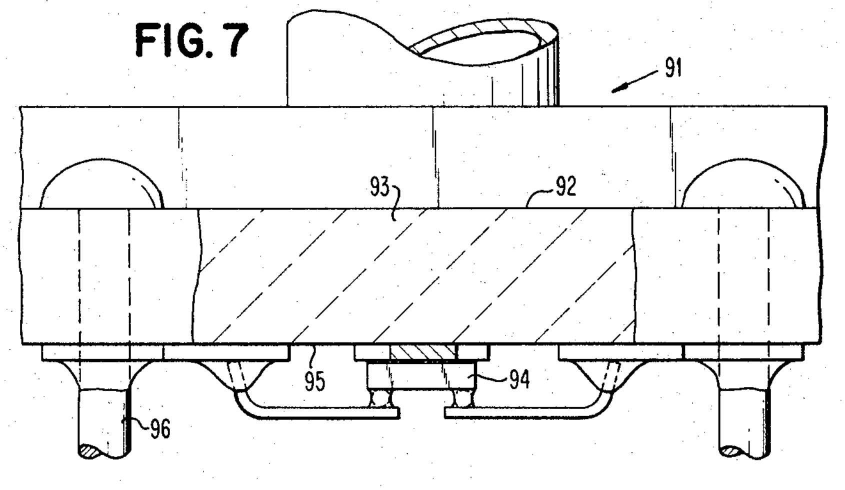
FIGURE 7 is an enlarged, sectional view of still another embodiment of the present invention in which active devices are mounted on the bottom surface of the substrate.

FIGURE 7 discloses still another embodiment of the present invention in which the thermally conductive rivet 91 is secured to the top surface 92 of an insulating substrate 93 and one or more semiconductive devices 94 are backside mounted to the bottom surface 95 of the substrate 93 directly beneath the rivet 91. This embodimnt has the advantage that an even shorter thermal path may be provided between the heat producing circuit elements and the thermal dissipator via the rivet 91.

The devices 94 on the surface 95 would be protected from contact with any second level carrier, e.g. printed circuit board, that the module may be carried on, such as by flaring the pins 96 at an appropriate distance below surface 95, or by some insulating type standoff device.

While the invention has been particularly shown and described with reference to the preferred embodiments thereof, it will be understood by those skilled in the art that the foregoing and other various changes in form and details may be made therein without departing from the spirit and scope of the invention.

What is claimed is:

1. A heat dissipating module assembly comprising:
an electrically insulating, thermally conductive substrate having a surface;
a conductive pattern formed on the surface of the substrate;
a plurality of semiconductive devices each having a low resistance semiconductor region on its backside, an ohmic metal contact system on the low resistance region and a solderable metal film on the system joined to the pattern;
a thermal dissipator; and
a thermal conductor completing a thermal path from the semiconductor devices through the conductive pattern and substrate to the thermal dissipator.

2. A heat dissipating module assembly comprising:
an electrically insulating, thermally conductive substrate having a surface;
a thermally and electrically conductive pattern formed on the substrate surface;
heat producing circuit elements having contacts;
at least one contact of each element joined to the pattern;
a rivet comprising a thermally conductive base plate in thermal contact with the substrate surface and a stud projecting outwardly of the base plate;
a thermally dissipating, electrically shielding cap mounted over the substrate surface, joined to the stud, and in contact with the substrate, the cap thus forming with the substrate surface an enclosed space surrounding the circuit element; and
terminal members electrically connected to the conductive pattern and extending through the substrate for connection to external circuitry.

3. A heat dissipating module assembly comprising:
a. an electrically insulating, thermally conductive substrate;
b. a conductive metal circuit pattern formed on the substrate;
c. heat producing circuit elements secured to the pattern;
d. a rivet comprising a thermally conductive base plate in thermal contact with the substrate and a stud projecting upwardly from the base plate; and
e. a thermal dissipator joined to the stud.

4. The assembly according to claim 5 wherein the heat producing circuit elements include a semiconductive device having a low resistance semiconductive region on its backside, an ohmic metal contact system on the low resistance region and a solderable metal film on the system joined to the pattern, and the thermal dissipator comprises a cap joined to the stud and defining with the substrate an enclosed space surrounding the circuit elements.

5. The assembly according to claim 3 wherein the substrate has a top and bottom surface, the rivet is secured to the top surface, and circuit elements are secured to the bottom surface.

6. A heat dissipating module assembly comprising:
a. an electrically insulating, thermally conductive substrate having
   1. a top and bottom surface
   2. sidewalls, and
   3. a plurality of outer and inner apertures extending through the top and bottom surface;
b. a conductive noble metal pattern formed on the top surface including
   1. a central rivet pad surrounding the inner apertures,
   2. a circuit layout electrically isolated from the rivet pad having
      (a) lines extending from the outer apertures
      (b) certain of the lines terminating in enlarged collector pads, the collector pads being in close proximity to the rivet pad;

c. pin members inserted in the apertures, the pins in the outer apertures forming electrical terminal members for connection to external circuitry, the pins in the inner apertures forming thermal paths from the substrate to the ambient environment;
d. a solder film formed on the pattern, including flattened portions over the collector pads;
e. heat producing transistors located on each flattened collector pad solder film, each transistor including a collector region located on the backside of the transistor having an ohmic metal contact system located on the collector region and a solderable metal film located on the ohmic metal contact system and joined to the flattened pad solder film, terminal contacts on the top surface of the transistor in electrical contact with its base and emitter regions;
f. thermally conductive straps electrically connecting the base and emitter terminal contacts to the lines;
g. a rivet comprising an apertured thermally conductive base plate joined to the rivet pad, the apertures in the plate being in registry with the pins in the inner apertures, and a tubular stud projecting upwardly from the base plate;
h. a conformed coating of a non-stress chemically inert material deposited over the top surface on which the rivet and transistors are located;
i. a centrally apertured, finned cap mounted over the substrate having sidewalls crimped to the side walls of the substrate, the tubular stud extending through the central aperture in the cap and flared over to form good mechanical and thermal contact therewith, the cap thus forming with the top surface of the substrate an enclosed region; and
j. a backside layer of a cured rubber-type material disposed over the bottom surface of the substrate and in contact with the sidewalls of the cap so as to prevent water vapor and other noxious industrial vapors from penetrating into the enclosed region.

7. A method of fabricating a heat dissipating module assembly which comprises the steps of:
a. forming a conductive noble metal pattern on the surface of an insulating, thermally conductive, apertured substrate including a joining pad and a circuit layout electrically isolated from the pad;
b. firing the substrate;
c. embedding a plurality of spaced terminal members in the layout;
d. coating the pattern with solder;
e. securing one terminal of a semiconductive device directly to the solder coated layout;
f. securing the remaining terminals of the device to the solder coated layout by means of thermally and electrically conductive straps;
g. securing a rivet to the pad; and
h. mechanically joining a thermally conductive finned cap to the rivet over the substrate.

References Cited

UNITED STATES PATENTS

| | | | |
|---|---|---|---|
| 3,253,196 | 5/1966 | Syvan | 317—234 |
| 3,284,675 | 11/1966 | Smith et al. | 317—234 |
| 3,217,213 | 11/1965 | Slater | 317—234 |
| 3,177,413 | 4/1965 | Roka | 317—234 |
| 3,280,384 | 10/1966 | Emeis | 317—234 |
| 3,089,067 | 5/1963 | Baird | 317—234 |
| 3,311,798 | 3/1967 | Gray | 317—234(1) |
| 3,356,904 | 5/1967 | Yonkers | 317—100 |

OTHER REFERENCES

IBM Technical Disclosure Bulletin, "Heat Dissipator Assemblies" Mandel, Melan, and Tepper, vol. 8 No. 10, pp. 1460–1461, 317–100.

ROBERT K. SCHAEFER, *Primary Examiner.*
M. GINSBURG, *Assistant Examiner.*